United States Patent [19]
Galbi et al.

[11] Patent Number: 5,420,456
[45] Date of Patent: May 30, 1995

[54] ZAG FUSE FOR REDUCED BLOW-CURRENT APPLICATION

[75] Inventors: Duane E. Galbi, Jericho; William H. Guthrie, Essex Junction; Oliver Kiehl, Essex Junction; Jack A. Mandelman, Essex Junction; Josef S. Watts, South Burlington, all of Vt.

[73] Assignees: International Business Machines Corporation, Armonk, N.Y.; and Siemens Corporation, Iselin, N.J.

[21] Appl. No.: 193,927

[22] Filed: Feb. 9, 1994

Related U.S. Application Data

[63] Continuation of Ser. No. 861,772, Apr. 2, 1992, abandoned.

[51] Int. Cl.$^6$ .............................................. H02H 7/20
[52] U.S. Cl. ....................... 257/529; 327/525
[58] Field of Search ...................... 307/202.1; 257/529

[56] References Cited

U.S. PATENT DOCUMENTS

| Re. 28,481 | 7/1975 | Shields et al. | 29/517 |
|---|---|---|---|
| 3,564,354 | 2/1971 | Aoki et al. | 317/235 |
| 3,959,047 | 5/1976 | Alberts et al. | 156/8 |
| 4,032,949 | 7/1977 | Bierig | 357/51 |
| 4,042,950 | 8/1977 | Price | 357/51 |
| 4,064,493 | 12/1977 | Davis | 365/96 |
| 4,162,538 | 7/1979 | Thornburg | 365/96 |
| 4,312,046 | 1/1982 | Taylor | 365/104 |
| 4,517,583 | 5/1985 | Uchida | 357/41 |
| 4,606,781 | 8/1986 | Vyne | 357/51 |
| 4,682,204 | 7/1987 | Shiozaki et al. | 357/51 |
| 4,713,680 | 12/1987 | Davis et al. | 357/51 |
| 4,812,419 | 3/1989 | Lee et al. | 437/203 |
| 4,870,472 | 9/1989 | Vyne | 357/51 |
| 4,882,293 | 11/1989 | Naumann et al. | 437/52 |
| 4,967,146 | 10/1990 | Morgan et al. | 357/55 |
| 4,984,054 | 1/1991 | Yamada et al. | 357/51 |
| 5,066,998 | 11/1991 | Fischer et al. | 357/51 |

FOREIGN PATENT DOCUMENTS

| 0112693A1 | 7/1984 | European Pat. Off. . |
|---|---|---|
| 0241046 | 10/1987 | European Pat. Off. . |
| 58-123759A | 7/1983 | Japan . |
| 2245099 | 12/1991 | United Kingdom . |

OTHER PUBLICATIONS

IBM Confidential, Toshiba 256K SRAM Row Address Circuitry, Mar. 20, 1985.
IBM Technical Disclosure Bulletin, On–Chip Electrically Programmable Fuse, vol. 29, No. 3, Aug. 1986.
IBM Technical Disclosure Bulletin, Minimum Groundrule, Electrically Blown Tungsten/Aluminum Fuse by Electromigration, vol. 31, No. 5.
IBM Technical Disclosure Bulletin, Electromigration Fuse, vol. 27, No. 4A, Sep. 1984.

Primary Examiner—David R. Hudspeth
Assistant Examiner—Andrew Sanders
Attorney, Agent, or Firm—Whitham, Curtis, Whitham & McGinn; Harold J. Walter

[57] ABSTRACT

A fuse, having reduced blow-current requirements thereby minimizing the power supply voltage and chip area required for the driver transistors, has a geometry which is characterized by an essentially uniform width dimension throughout the primary axis of the fuse link but having at least one approximately right angle bend in the fuse link. The fuse can be blown open with approximately 10% of the input current density required for a straight fuse of equal cross-sectional area. The reason for this is that, due to current crowding, the current density is accentuated at the inside corner of the bend. As the input current to the fuse is increased, a current density is reached at the inside corner which causes the fuse material to melt. A notch forms at the inside corner. The fuse geometry altered by the notching causes even more severe current crowding at the notches, and this in turn makes the melting propagate across the width of the fuse. The predictability of the point of fuse blow out allows even greater circuit densities while minimizing the possibility of accidental damage to adjacent devices.

20 Claims, 5 Drawing Sheets

ZAG FUSE FOR REDUCED BLOW-CURRENT APPLICATION

This is a Continuation of application No. 07/861,772 filed Apr. 2, 1992, now abandoned.

BACKGROUND OF THE INVENTION

1. Field of the Invention

The present invention generally relates to fuses used in semiconductor technology for implementation of redundancy or custom wiring and, more particularly, to fuses exhibiting reduced blow-current requirements.

2. Description of the Prior Art

Redundancy in integrated circuit memories is part of current wafer and chip manufacturing strategy to improve yield. By providing redundant circuits on chips, integrated circuit memory yields are increased by eliminating from circuit operation those circuits or modules which are defective or are not needed. The practice is to blow fuses which allow redundant memory cells to be used in place of cells that are nonfunctional. In the manufacture of integrated circuits, it is also common practice to provide for customization of chips and modules to adapt chips to specific applications. In this way, a single integrated circuit design may be economically manufactured and adapted to a variety of custom uses.

Fuses have been used in lower performance products where the method of blowing the fuses is with a laser. This is not practical in high performance products and, therefore, the preferred method of blowing the fuses is by means of high currents. Typically, fuses or fusible links are incorporated in the integrated circuit design, and these fuses or fusible links are selectively blown by passing an electrical current of sufficient magnitude through them to cause them to open. For example, U.S. Pat. No. 3,959,047 to Alberts et at. discloses a metalized fuse construction in the form of straight links which are "necked" to cause a high current concentration to heat and open the links. An on-chip programmable polysilicon fuse is described in *IBM Technical Disclosure Bulletin*, vol. 29, no. 3, Aug. 1986, pp. 1291, 1292, and a tungsten/aluminum fuse blown by electromigration is described in *IBM Technical Disclosure Bulletin*, vol. 31, no. 5, Oct. 1988, pp. 347, 348.

The technology for high density, very large scale integrated (VLSI) circuits is being pushed to dimensional limits. In the future it may be extremely difficult to form fuses in a manner in which "necking" or constrictions can be used to force a localized current to open a fuse. Moreover, the "real estate" of the chip itself, always a valuable commodity, is becoming even more "expensive" with ever increasing transistor densities. This means that the power supplies and driver transistors required to blow the fuses must compete for space on the chip with functional circuitry of the chip. For example, using deep submicron design, P+ polysilicon straight fuses require approximately 10 mA/fuse to be blown-open. As a result, the fuse driver transistors must have a width of at least 30 μm and require a supply voltage of 5 V. In one application, the straight current-blown fuses and their drivers would add approximately 1.9% to the chip area, and the high voltage required for fuse blow makes programmability in a system environment costly.

The relatively high current required for fuses having straight geometry to be blown-open constrains the minimum size of the fuse drive transistors and/or their supply voltage. Module level programmability requires a supply voltage which is higher than the normal operating voltage and very large driver transistors. If in-system programmability is desired, providing the higher than normal operating voltage for blowing the straight fuses is costly.

U.S. Pat. No. 4,064,493 to Davis discloses a low-current fusible programming link which depends on electromigration to blow the link. Location of the link in proximity to a collector-base junction aids in heating the link, thereby reducing the current required to open the link. Davis' preferred fuse material is aluminum for enhanced electromigration effect. The design of the fuse link therefore is limited to both material and proximity to a semiconductor junction to provide heat. This considerably restricts the circuit design and limits the applications of the Davis fuse link.

SUMMARY OF THE INVENTION

It is therefore an object of the present invention to provide a fuse having reduced blow-current requirements thereby minimizing the power supply voltage and chip area required for the driver transistors.

It is another object: of the invention to provide a fuse which may be manufactured using conventional integrated circuit fabrication techniques and imposes no special requirements on integrated circuit design.

According to the invention, there is provided a fuse having a geometry which requires approximately an order of magnitude less current to be blown-open than does a straight fuse having equal cross-section area. The specific geometry involves one or more right angle, or approximately right angle, bends in the fuse link, giving rise to the term "ZAG" fuse. The mechanism employed for blowing the ZAG fuse involves current crowding at the corners of the bends. The current crowding produces a melt zone in fuse link which rapidly propagates from the inside corner to the outside corner of the bend.

The ZAG fuses according to the invention may be made using conventional semiconductor manufacturing techniques. Manufacture of the fuses requires no additional masks or processing steps. The preferred material is P+ polysilicon, but other materials including, for example, aluminum may be used depending on the application and the integrated circuit design in which the fuses are used. The specific geometry may also be tailored for the specific application but, in any case, the geometry allows for precise placement of the point (the corner of the bend in the fuse) at which the fuse blows open, thereby avoiding accidental damage to other devices on the chip. Due to the low voltage and low current requirements for blowing the fuses, relatively small fuse drivers may be used saving valuable chip real estate and minimizing power supply demand.

Although the fuse geometry in U.S. Pat. No. 4,064,493 to Davis, supra, contains right angle bends, the Davis fuse is fundamentally different in that it depends on electromigration to open the fuse and requires a semiconductor junction for heat to accelerate the electromigration mechanism. Despite the right angle bend in the Davis fuse, the fuse is intended to blow within the straight section intersecting the semiconductor junction and not at the corners. Thus, Davis failed to recognize that current crowding could be used as the blowing mechanism. The ZAG fuse according the invention requires no external source of heat and therefore is less complex than the Davis fuse, an important factor in ever more complex and dense integrated circuit designs. Moreover, since the fuse opening mechanism does not rely on electromigration, polysilicon as well as other conductors can be used in the fabrication of the fuse.

The invention allows low cost in-system programming because sufficient current may be obtained with normal operating supply voltages. If only module level programmability is desired, savings in the area occupied by the fuses and their drivers may be realized, because the availability of higher programming voltages results in reduced width requirements for the driver transistors.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
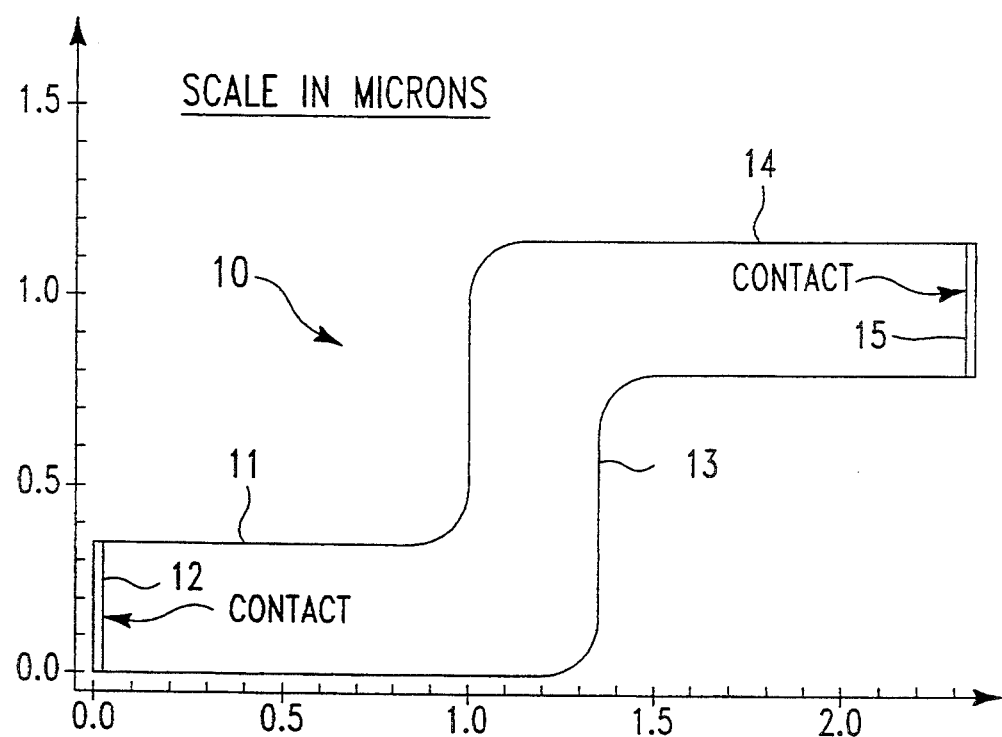
FIG. 1 is a plan view showing the stepped geometry of the ZAG fuse according to a preferred embodiment of the invention.

Referring now to the drawings, and more particularly to FIG. 1, there is shown a fuse 10 according to a preferred embodiment of the invention. This fuse has a first horizontal leg 11 having a free end 12 which serves as a first contact for the fuse, a second vertical leg 13, and a third horizontal leg 14 having a free end 15 which serves as a second contact for the fuse. Here it will be understood that "horizontal" and "vertical" are relative terms which define two 90° bends in the fuse link. This geometry gives rise to the terminology of a "ZAG" fuse. The fuse is characterized by an essentially uniform width dimension throughout the primary axes of the fuse legs 11, 13 and 14. As will become clear from the following description, the ZAG fuse requires only one bend, the second bend in the fuse shown in FIG. 1 being redundant. Moreover, the bend need not be 90° but may be greater or less than 90°, within practical limits.

Figure 2:
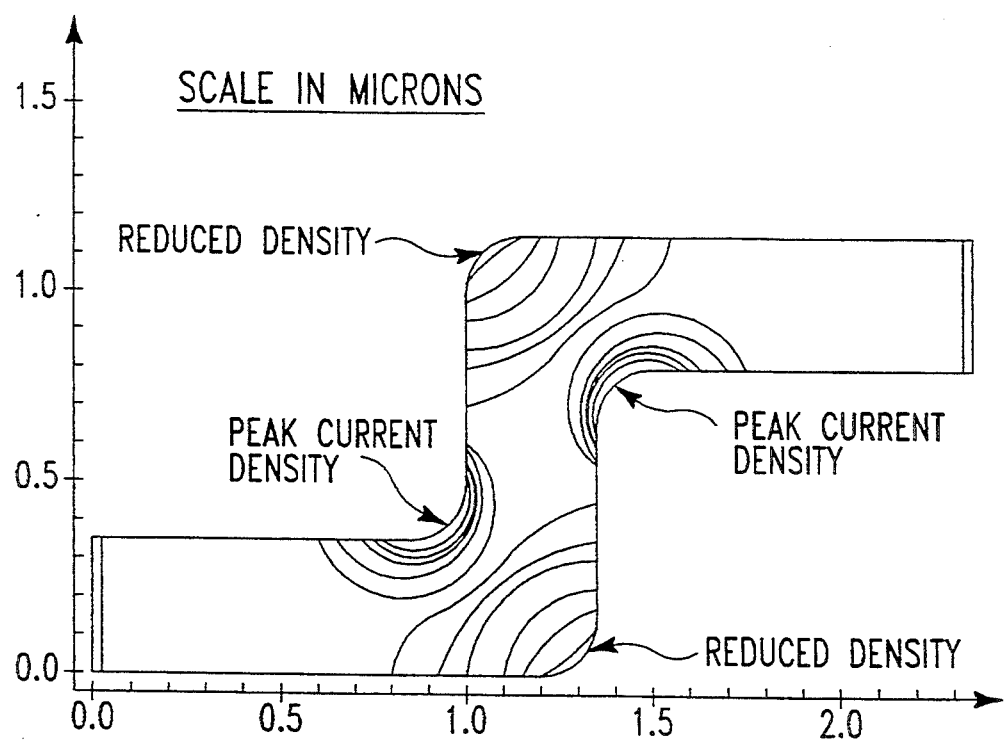
FIG. 2 is a plan view of the ZAG fuse of FIG. 1 showing the accentuated current density at inside corners for this geometry.
Figure 3:
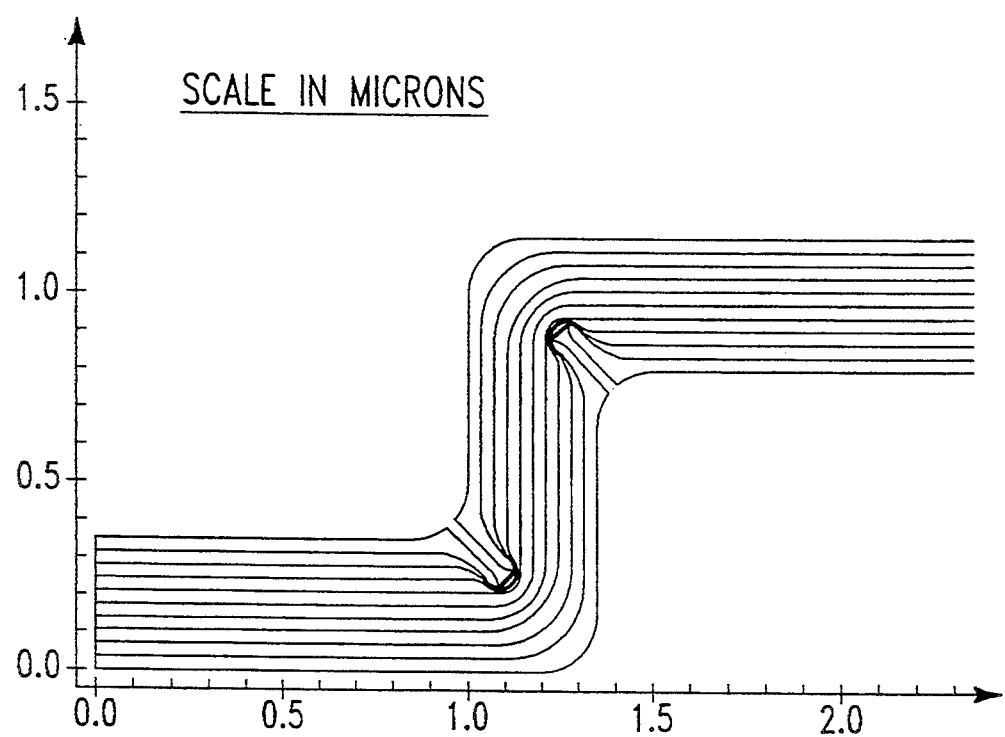
FIG. 3 is a plan view of the ZAG fuse of FIG. 1 showing the propagation of melting across the fuse.

Experimental modeling has shown that the fuse shown in FIG. 1 can be blown open with approximately 10% of the input current density required for a straight fuse of equal cross-sectional area. The reason for this is shown in FIG. 2. Due to current crowding, the current density is accentuated at the inside corners of the fuse. As the input current to the fuse is increased, a current density is reached at the inside corners which causes the fuse material to melt. A notch forms at each inside corner, as shown in FIG. 3. The fuse geometry altered by the notching causes even more severe current crowding at the notches, and this in turn makes the melting propagate across the width of the fuse.

Figure 4:
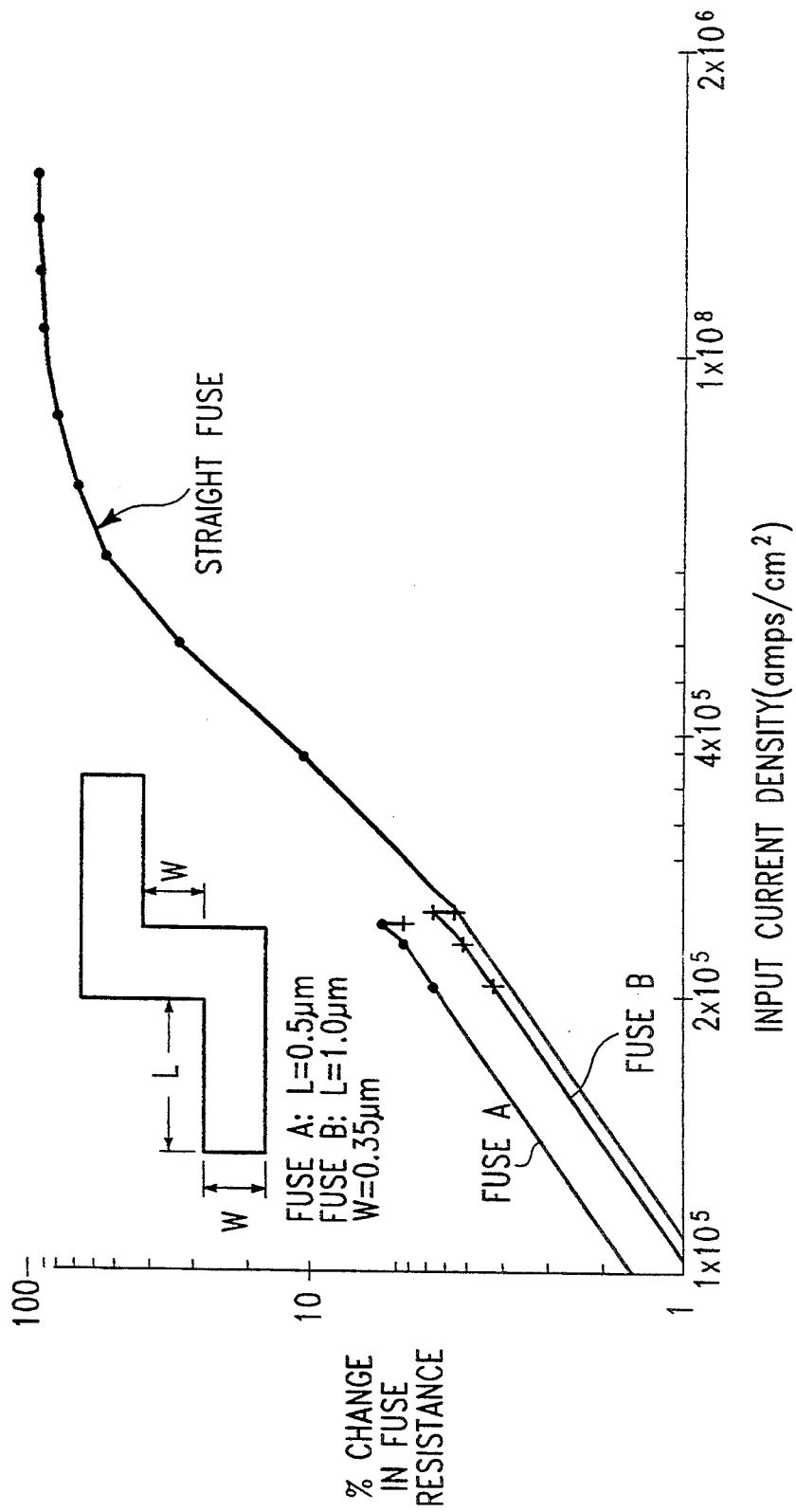
FIG. 4 is a graph of data showing comparative current densities for blowing the ZAG fuse according to the invention and a conventional straight fuse.

FIG. 4 graphically shows comparative data of the computer modeling represented by FIGS. 2 and 3. All fuses were 0.35 $\mu$m wide and made of P+ polysilicon. Fuse A and fuse B both had the same geometry as represented in the upper left corner of the graph, the only difference being the length, L, of the "horizontal" legs. The ZAG fuses A and B both blew with input current densities between $2 \times 10^5$ and $3 \times 10^5$ amps/cm$^2$, the only difference being the fuse resistances with increase in current densities. From the graph, it will be observed that the resistances of fuses A and B actually decreased slightly before actually blowing. This decrease in resistance was due to melting of the fuse material just before blowing. In contrast, the straight fuse did not blow until a current density approaching $2 \times 10^6$ amps/cm$^2$ was reached.

The following description describes but one way to manufacture the ZAG fuses according to the invention. The process described is specifically for fuses made of P+ polysilicon, but those skilled in the semiconductor manufacturing arts will understand that different processes and different materials may be used, all being conventional.

Figure 5:
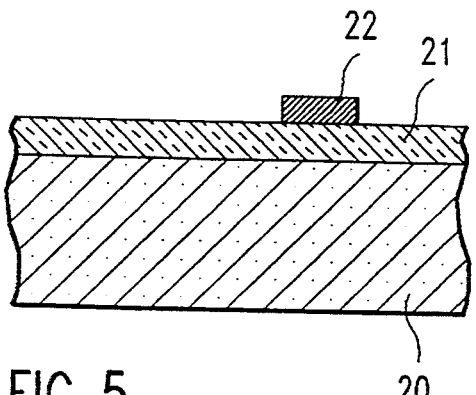
FIG. 5 is a cross-sectional view of a semiconductor substrate showing a process of fabricating a ZAG fuse.
Figure 6:
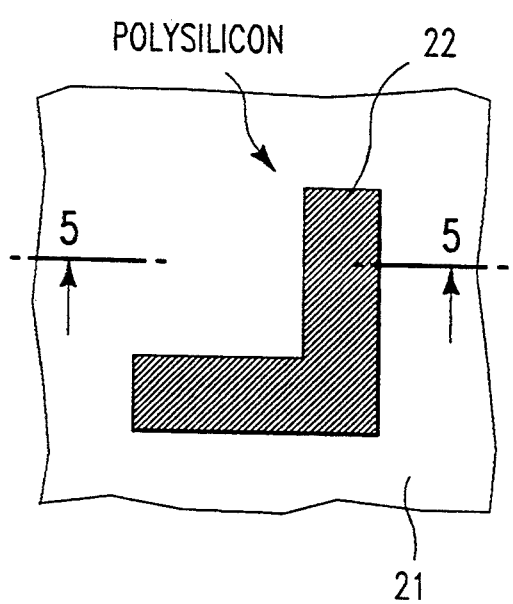
FIG. 6 is a plan view of the ZAG fuse shown in FIG. 5.

With reference now to FIGS. 5 and 6, there is shown in cross-section and plan view, respectively, an intermediate stage in the manufacturing process. The cross-section of FIG. 5 is taken along section line 5—5 in FIG. 6. First, an insulating layer 21 is formed on a silicon substrate 20. The insulating layer may be SiO$_2$ or Si$_3$N$_4$, for example, the choice of insulator being a function primarily of the overall integrated circuit design. Next, a polysilicon layer 22 is deposited using CVD or PECVD techniques. Using a mask and conventional etching techniques, a ZAG fuse pattern is defined resulting in the structure shown in FIGS. 5 and 6.

Figure 7:
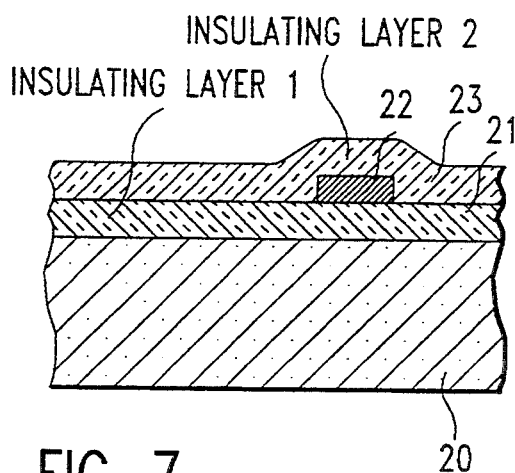
FIG. 7 is a cross-sectional view of the semiconductor substrate of FIG. 5 after further processing.
Figure 8:
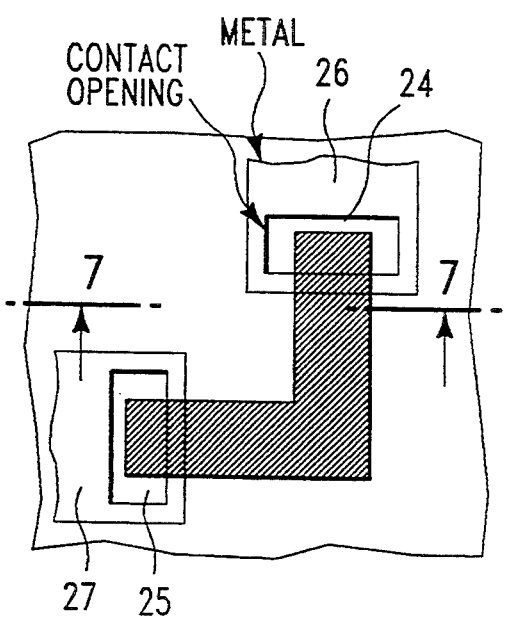
FIG. 8 is a plan view of the ZAG fuse and its interconnections.

Turning next to FIGS. 7 and 8 which again show respectively a cross-section and plan view of the integrated circuit structure, a second insulating layer 23 is applied over the first insulating layer 21 and the polysilicon ZAG fuse 22. The ZAG fuse 22 is thus completely enclosed between the two insulating layers which serves to protect integrated circuit devices in close proximity to the fuse when it is blown. As best shown in FIG. 8, the next step in the fabrication of the fuse is to open contact holes 24 and 25 through the second insulating layer 23 to expose the free end of the ZAG fuse. Finally, metal contacts 26 and 27 are deposited through a mask to fill the contact holes and provide the connections to the associated circuit.

Figure 9:
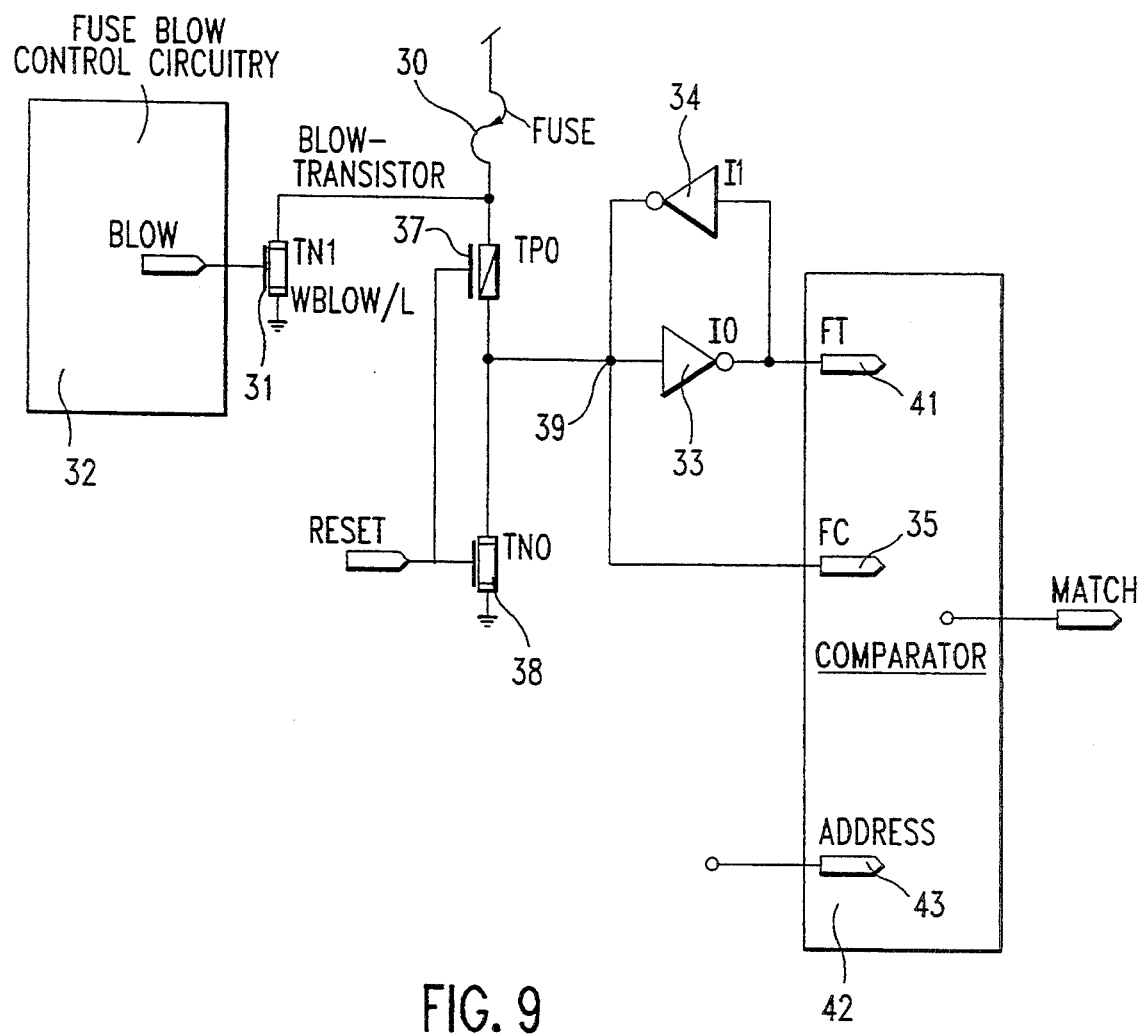
FIG. 9 is a schematic diagram of a circuit for blowing a ZAG fuse according to the invention.

FIG. 9 shows an example of a CMOS circuit which may be used with the ZAG fuse 30 according to the invention. The ZAG fuse 30 is blown by means of N-type FET transistor 31 which is turned on by blow control circuitry 32. A circuit is provided to detect the status of the fuse; i.e., blown or unblown. This circuit is a latch composed of a pair of cross-coupled inverters 33 and 34. The latch stores the information of the fuse status. To read the information, the output node 35 is pulled low by bringing the reset input 36 high. The reset input 36 drives a series connected complementary pair of FETs 37 and 38, the drains of which are connected to reset node 39 of the cross-coupled inverters 33 and 34. The ZAG fuse 30 is connected in series with the FETs 37 and 38. After the reset node 39 is pulled low by bringing the reset input 36 high, the reset input 36 is pulled low again. If fuse 30 has not been blown, the output node 35 will be restored to high through FET 37. If on the other hand the fuse 30 has been blown, bringing the reset input 36 back to low will leave the output node 35 low. The output node 35 and its complementary node 41 of the latch may be used in a comparator 42 with an address input 43 to address the specific fuse latch combination.

In the fuse latch circuit, care must be taken that, under normal operating conditions, no condition will occur that the fuse will be accidently blown. In the circuit shown in FIG. 9, this is assured by the fact that only at power on is there a limited current through the fuse 30 for a short time to set the latch 33, 34. The outputs 35 and 41 control a transistor (the comparator 42) which carries current or insulates depending on the state of the fuse. There is no current in the fuse itself; however, other applications may be supported which require a small current through the fuse in normal operation.

If through means of the fuse blow control circuitry 32 the input "blow" is brought high, a high current will flow through transistor 31 which will blow the fuse 30. While the other transistors in the circuit have small dimensions, transistor 31 is relatively large to carry the current necessary to blow the fuse 30. However, due to the very small currents required to blow the ZAG fuse according to the invention, the size of transistor 31 may be markedly reduced compared to those used in the prior art. This is important because, even with the reduction in size of the transistor 31, it is still a large device, dominating the area consumed by the rest of the fuse circuitry. In the application where straight fuses added approximately 1.9% to the chip area, the use of ZAG fuses according to the invention add only 0.8% to the chip area due to the reduced driver width requirements if a 5 V supply is used for programming at module level. This is a savings of 50%.

Possible uses for module level programming are chip personalization, such as chip mode selection. Personalization at module level decreases the number of module types that need to be stocked. Module level fuses could also be used to recover burn-in failures. If, on the other hand, the drivers are kept at the same size as for the straight fuse, the ZAG fuses may be programmed with a 3.3 V supply, allowing for low cost in-system programming. In-system programmability allows failures to be fixed while the chip is still in the system.

Thus, the ZAG fuse, having a stepped geometry according to the invention, has significant advantages over straight current-blown fuses including reduced supply voltage requirements and reduced chip area impact because of smaller driver transistors which make module level personalization attractive and system level programming possible at low cost.

While the invention has been described in terms of a single preferred embodiment, those skilled in the art will recognize that the invention can be practiced with modification within the spirit and scope of the appended claims. For example, the fuse of the invention can also be implemented in other than a single plane by passing the link over a step on the surface of a substrate.

Having thus described our invention, what we claim as new and desire to secure by Letters Patent is as follows:

1. A fuse structure used in semiconductor circuitry for implementation of redundancy or custom wiring, comprising:
    a semiconductor substrate having an upper surface,
    a conductive strip of fuse material positioned on said upper surface of said semiconductor substrate and forming a fuse link,
    wherein said strip includes first and second strip portions orthogonally formed and having a predetermined width, said first and second strip portions being coupled together by a third strip portion having a width not less than said predetermined width,
    a surface of each of said first, second and third strips being substantially co-planar with each other and parallel to said upper surface of said semiconductor substrate,
    said strip having at least one bend in the fuse link such that, due to current crowding, current density is accentuated at the bend of the fuse link and, as input current to the fuse link is increased, a current density is reached at a first corner of said bend which causes the fuse material to melt, thereby forming a notch at the first corner of the bend which propagates to a corresponding second corner of the fuse link.

2. The fuse structure recited in claim 1 wherein said fuse material is P+ polysilicon.

3. The fuse structure recited in claim 2, further comprising a plurality of layers of insulating material, wherein said strip is encapsulated between two layers of insulating material of said plurality of layers of insulating material, and said fuse structure further comprising electrical contacts formed in holes exposing free ends of the strip.

4. The fuse structure recited in claim 1 wherein said strip includes a plurality of bends providing a plurality of redundant points at which the fuse is blown due to current crowding.

5. A method of manufacturing a fuse structure used in semiconductor circuitry for implementation of redundancy or custom wiring, comprising the steps of:
    forming a first insulating layer over a silicon substrate;
    depositing a conductive material on said first insulating layer;
    defining a fuse link in said conductive material including first and second conductive material portions orthogonally formed and having a predetermined width, said first and second conductive material portions being coupled together by a third conductive material portion having a width not less than said predetermined width,
    a surface of each of said first, second and third strips being substantially co-planar with each other and parallel to an upper surface of said silicon substrate,
    said fuse link having at least one bend in the fuse link such that, due to current crowding, current density is accentuated at the bend of the fuse link and, as input current to the fuse link is increased, a current density is reached which causes the fuse material to melt;
    depositing a second insulating layer over said first insulating layer and said fuse link, thereby encapsulating said fuse link;
    opening holes in said second insulating layer to expose free ends of said fuse link; and depositing electrical contacts for the fuse link in said holes.

6. The method recited in claim 5 wherein said conductive material is P+ polysilicon.

7. The fuse structure recited in claim 1, wherein said fuse material comprises P+ polysilicon.

8. The method recited in claim 5, wherein said fuse material comprises P+ polysilicon.

9. The fuse structure recited in claim 1, wherein said at least one bend includes a substantially right angle.

10. The method recited in claim 5, further comprising the step of providing said at least one bend with a substantially right angle.

11. The fuse structure recited in claim 1, wherein said first corner of said at least one bend includes an inside corner, said current density being accentuated at said inside corner of said at least one bend.

12. The method recited in claim 5, further comprising the step of providing said at least one bend with a first corner, said current density being accentuated at said first corner of said at least one bend.

13. The fuse structure recited in claim 1, further comprising a notch formed in said at least one bend by melting of the fuse material, said notch being formed in said first corner of said at least one bend and propagating to said second corner of said at least one bend.

14. The method recited in claim 5, further comprising steps of providing said at least one bend with first and second corners,
forming a notch in said bend by melting the fuse material, said notch being formed in said first corner of said at least one bend and propagating to said second corner of said at least one bend.

15. The fuse structure recited in claim 1, wherein said strip has a uniform cross-sectional area.

16. The method recited in claim 5, further comprising a step of providing said strip with a uniform cross-sectional area.

17. The fuse structure recited in claim 1, wherein said strip has a uniform cross-sectional thickness.

18. The method recited in claim 5, further comprising a step of providing said strip with a uniform cross-sectional thickness.

19. A fuse structure used in semiconductor circuitry for implementation of redundancy or custom wiring, comprising:
a semiconductor substrate having an upper surface,
a conductive strip of fuse material positioned on said upper surface of said semiconductor substrate and forming a fuse link,
wherein said strip includes first and second strip portions orthogonally formed and having a predetermined width, said first and second strip portions being coupled together by a third strip portion having a width not less than said predetermined width,
a surface of each of said first, second and third strips being substantially co-planar with each other,
said strip having at least one bend in the fuse link such that, due to current crowding, current density is accentuated at the bend of the fuse link and, as input current to the fuse link is increased, a current density is reached at a first corner of said bend which causes the fuse material to melt, thereby forming a notch at the first corner of the bend which propagates to a corresponding second corner of the fuse link,
wherein said surface of each of said first, second and third strip portions, respectively, is substantially co-planar with said upper surface of said semiconductor substrate.

20. A method of manufacturing a fuse structure used in semiconductor circuitry for implementation of redundancy or custom wiring, comprising the steps;
forming a first insulating layer over a silicon substrate:
depositing a conductive material on said first insulating layer;
defining a fuse link in said conductive material including first and second conductive material portions orthogonally formed and having a predetermined width, said first and second conductive material portions being coupled together by a third conductive material portion having a width not less than said predetermined width,
a surface of each of said first, second and third strips being substantially co-planar with each other,
said fuse link having at least one bend in the fuse link, such that, due to current crowding, current density is accentuated at the bend of the fuse link and, as input current to the fuse link is increased, a current density is reached which causes the fuse material to melt:
depositing a second insulating layer over said first insulating layer and said fuse link, thereby encapsulating said fuse link;
opening holes in said second insulating layer to expose free ends of said fuse link; and
depositing electrical contacts for the fuse link in said holes,
wherein said step of defining a fuse link includes forming said first, second and third strip portions such that said surface of each of said first, second and third strip portions, respectively, is substantially co-planar with an upper surface of said silicon substrate.

* * * * *